(12) United States Patent
Onuki et al.

(10) Patent No.: US 10,764,520 B2
(45) Date of Patent: Sep. 1, 2020

(54) SOLID STATE IMAGING DEVICE

(71) Applicant: CANON KABUSHIKI KAISHA, Tokyo (JP)

(72) Inventors: Yusuke Onuki, Fujisawa (JP); Yasushi Matsuno, Fujisawa (JP); Takafumi Miki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 16 days.

(21) Appl. No.: 15/872,190

(22) Filed: Jan. 16, 2018

(65) Prior Publication Data

US 2018/0213169 A1 Jul. 26, 2018

(30) Foreign Application Priority Data

Jan. 23, 2017 (JP) ................................ 2017-009174

(51) Int. Cl.
*H04N 5/365* (2011.01)
*H04N 5/357* (2011.01)
(Continued)

(52) U.S. Cl.
CPC ............. *H04N 5/365* (2013.01); *G08G 1/166* (2013.01); *H01L 27/14603* (2013.01);
(Continued)

(58) Field of Classification Search
CPC .... H04N 5/365; H04N 5/361; H04N 5/37452; H04N 5/357; H04N 5/3575; H04N 5/359;
(Continued)

(56) References Cited

U.S. PATENT DOCUMENTS 8,115,848 B2 2/2012 Onuki et al.
8,427,564 B2 4/2013 Yamashita et al.
(Continued)

FOREIGN PATENT DOCUMENTS

JP 2011-216970 A 10/2011
JP 2014-170966 A 9/2014

OTHER PUBLICATIONS

U.S. Appl. No. 15/834,293, filed Dec. 7, 2017. Applicant: Daisuke Yoshida, et al.

(Continued)

*Primary Examiner* — Timothy J Henn
(74) *Attorney, Agent, or Firm* — Venable LLP

(57) ABSTRACT

A disclosed embodiment includes: semiconductor substrate including a pixel region in which a plurality of pixels are arranged, each of the pixels including a photoelectric conversion unit configured to accumulate charges generated from an incident light, a charge holding portion configured to hold the charges transferred from the photoelectric conversion unit, and an amplification unit including an input node configured to receive the charges transferred from the charge holding portion; a light-shielding portion arranged so as to cover at least the charge holding portion and extending over at least two or more of the plurality of pixels; a contact plug connected to the light-shielding portion; and a wiring connected to the contact plug to supply a fixed potential to the light-shielding portion via the contact plug.

17 Claims, 9 Drawing Sheets

(51) Int. Cl.
  *H04N 5/359* (2011.01)
  *H04N 5/378* (2011.01)
  *G08G 1/16* (2006.01)
  *H04N 5/3745* (2011.01)
  *H01L 27/146* (2006.01)
  *H04N 5/361* (2011.01)

(52) U.S. Cl.
  CPC .. H01L 27/14612 (2013.01); H01L 27/14623 (2013.01); H04N 5/357 (2013.01); H04N 5/359 (2013.01); H04N 5/3575 (2013.01); H04N 5/361 (2013.01); H04N 5/378 (2013.01); H04N 5/37452 (2013.01); H04N 5/37457 (2013.01); *H01L 27/1463* (2013.01); *H01L 27/14643* (2013.01)

(58) Field of Classification Search
  CPC .............. H04N 5/37457; H04N 5/378; H01L 27/14612; H01L 27/14623; H01L 27/14603; H01L 27/14643; H01L 27/1463; G08G 1/166
  See application file for complete search history.

(56) References Cited

U.S. PATENT DOCUMENTS

| | | | |
|---|---|---|---|
| 8,736,734 B2 | 5/2014 | Onuki et al. | |
| 8,810,703 B2 | 8/2014 | Machida | |
| 9,019,141 B2 | 4/2015 | Hashimoto et al. | |
| 9,049,389 B2 | 6/2015 | Hashimoto et al. | |
| 9,159,750 B2 | 10/2015 | Ikeda et al. | |
| 9,247,161 B2 | 1/2016 | Hashimoto et al. | |
| 9,300,889 B2 | 3/2016 | Hashimoto et al. | |
| 9,485,445 B2 | 11/2016 | Hashimoto et al. | |
| 9,602,752 B2 | 3/2017 | Kobayashi et al. | |
| 9,615,044 B2 | 4/2017 | Hashimoto et al. | |
| 9,716,849 B2 | 7/2017 | Kobayashi et al. | |
| 9,838,633 B2 | 12/2017 | Muto et al. | |
| 9,838,637 B2 | 12/2017 | Muto et al. | |
| 9,876,975 B2 | 1/2018 | Yoshida et al. | |
| 9,894,295 B2 | 2/2018 | Kawabata et al. | |
| 2008/0023780 A1* | 1/2008 | Jung | H01L 27/14618 257/432 |
| 2010/0053398 A1* | 3/2010 | Yamashita | H04N 5/3595 348/302 |
| 2011/0074969 A1* | 3/2011 | Takeda | H01L 27/14685 348/222.1 |
| 2012/0286137 A1* | 11/2012 | Yamaguchi | H01L 27/14607 250/208.1 |
| 2012/0300106 A1* | 11/2012 | Kobayashi | H01L 27/14603 348/308 |
| 2013/0206965 A1 | 8/2013 | Yamashita et al. | |
| 2016/0093658 A1* | 3/2016 | Hsu | H01L 27/14621 250/208.1 |
| 2016/0133865 A1* | 5/2016 | Yamaguchi | H01L 27/14623 257/40 |
| 2017/0078557 A1 | 3/2017 | Kawabata et al. | |
| 2017/0078604 A1 | 3/2017 | Kobayashi et al. | |
| 2017/0142363 A1 | 5/2017 | Hashimoto et al. | |
| 2017/0289478 A1 | 10/2017 | Kobayashi et al. | |
| 2017/0294470 A1 | 10/2017 | Takami et al. | |
| 2017/0359535 A1 | 12/2017 | Kobayashi et al. | |
| 2017/0359538 A1 | 12/2017 | Kobayashi et al. | |
| 2017/0359539 A1 | 12/2017 | Kawabata et al. | |
| 2019/0273105 A1* | 9/2019 | Yamaguchi | H01L 27/14621 |

OTHER PUBLICATIONS

U.S. Appl. No. 15/791,909, filed Oct. 24, 2017. Applicant: Hiroshi Sekine, et al.

U.S. Appl. No. 15/872,208, filed Jan. 16, 2018. Applicant: Takafumi Miki.

* cited by examiner

SOLID STATE IMAGING DEVICE

BACKGROUND OF THE INVENTION

Field of the Invention

The present invention relates to a solid state imaging device.

Description of the Related Art

In recent years, solid state imaging devices used for imaging systems such as a digital video camera, a digital still camera, or the like which use a CMOS image sensor that has low power consumption and enables fast readout have been prevalent. As a scheme for fast readout of an image, a CMOS image sensor having a global electronic shutter function that controls drive timings of electronic switches so as to simultaneously start and simultaneously stop exposure in all the pixels has been proposed.

In some solid state imaging devices having a global electronic shutter function, a light-shielding portion that shields a region except a photodiode, which is a light receiving portion, from a light is provided. Japanese Patent Application Laid-Open No. 2011-216970 discloses a solid state imaging device having a light-shielding portion configured such that a control pulse is applied to the light-shielding portion to drain charges accumulated in a photodiode. Japanese Patent Application Laid-Open No. 2014-170966 discloses a method of forming a light-shielding portion and a contact plug connected to the light-shielding portion.

In the solid-state imaging device as disclosed in Japanese Patent Application Publication No. 2011-216970 and Japanese Patent Application Publication No. 2014-170966, the light-shielding portion causes a parasitic capacitance. Thus, when operations such as transfer, reset, or the like are simultaneously performed, fluctuation of the power source potential and the ground potential may occur through such a parasitic capacitance. This potential fluctuation may result in a noise to an output signal.

SUMMARY OF THE INVENTION

According to an aspect of the present invention, provided is a solid state imaging device including: a semiconductor substrate including a pixel region in which a plurality of pixels are arranged, each of the pixels including a photoelectric conversion unit configured to accumulate charges generated from an incident light, a charge holding portion configured to hold the charges transferred from the photoelectric conversion unit, and an amplification unit including an input node configured to receive the charges transferred from the charge holding portion; a light-shielding portion arranged so as to cover at least the charge holding portion and extending over at least two or more of the plurality of pixels; a contact plug connected to the light-shielding portion; and a wiring connected to the contact plug to supply a fixed potential to the light-shielding portion via the contact plug.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Throughout a plurality of drawings, the component having the same function is labeled with the same reference symbol, and the description thereof may be omitted or simplified.

First Embodiment

Figure 1:
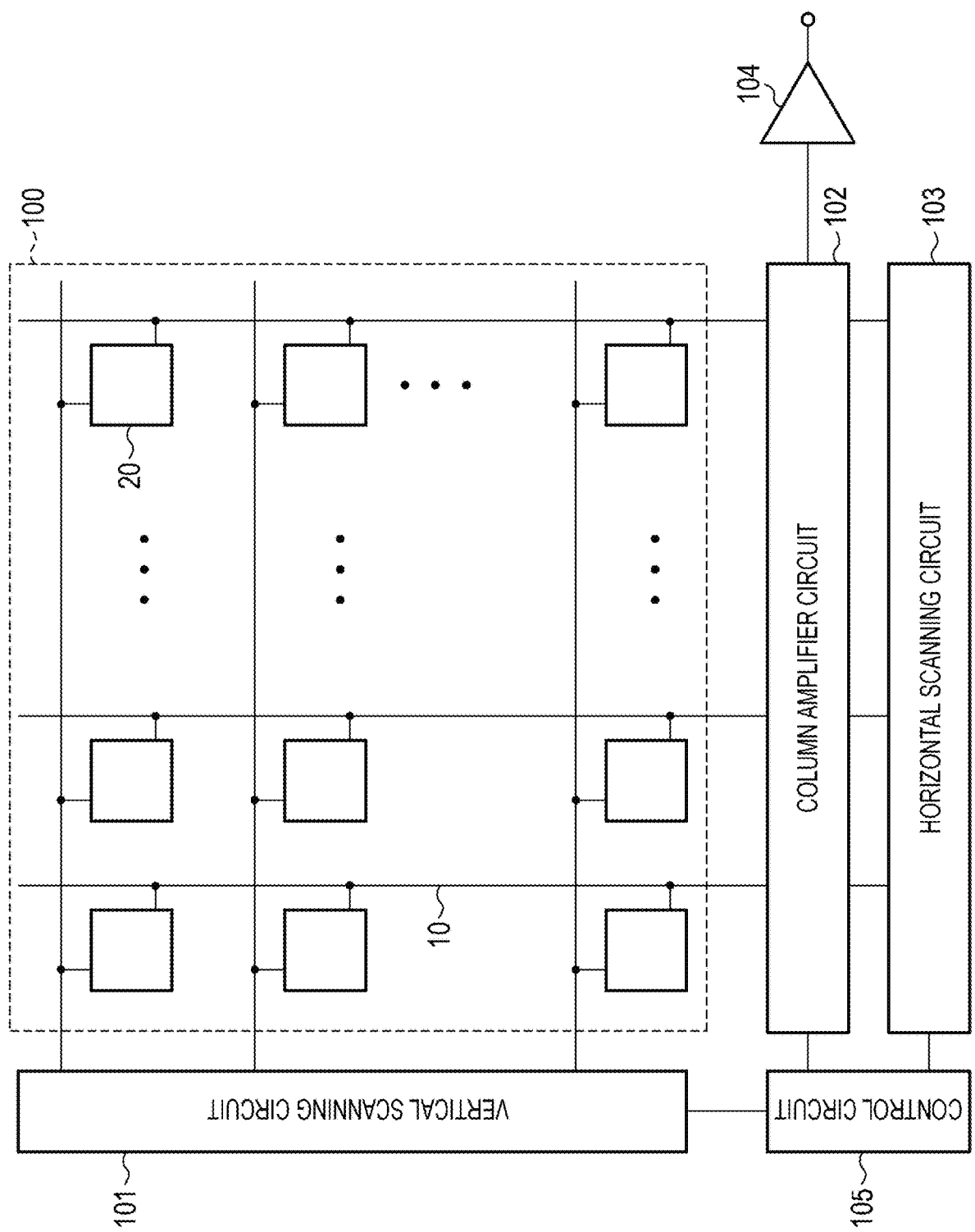
FIG. 1 is a block diagram of a solid state imaging device according to a first embodiment.

FIG. 1 is a block diagram illustrating a general configuration of a solid state imaging device according to the present embodiment. The solid state imaging device has a pixel array 100, a vertical scanning circuit 101, a column amplifier circuit 102, a horizontal scanning circuit 103, an output circuit 104, and a control circuit 105. The solid state imaging device is a semiconductor device formed on a semiconductor substrate such as a silicon substrate and is a CMOS image sensor in the present embodiment. The pixel array 100 has a plurality of pixels 20 arranged in a two-dimensional matrix including a plurality of rows and a plurality of columns on the semiconductor substrate. The vertical scanning circuit 101 supplies a plurality of control signals for controlling a plurality of transistors included in the pixels 20 to be turned on (conduction state) or turned off (non-conduction state). Note that, although a single control line is depicted for each row with respect to the control lines that supply these control signals in the drawing, a plurality of control lines may be arranged in accordance with the number of control signals in the actual implementation. In the vertical scanning circuit 101, logic circuits such as a shift resistor, an address decoder, and the like may be used.

The vertical output lines 10 are provided for respective columns of the pixels 20, signals from the pixels 20 are read out to the vertical output lines 10 on a column basis. The column amplifier circuit 102 amplifies pixel signals output to the vertical output lines 10 and performs a process such as a correlated double sampling process based on a signal at reset and a signal at photoelectric conversion of the pixel 20. The horizontal scanning circuit 103 has a switches connected to amplifiers of the column amplifier circuit 102 and supplies control signals for controlling these switches to be turned on or off. The control circuit 105 controls the vertical scanning circuit 101, the column amplifier circuit 102, and the horizontal scanning circuit 103. The output circuit 104 includes a buffer amplifier, a differential amplifier, or the like and outputs pixel signals from the column amplifier circuit 102 to a signal processing unit outside the solid state imaging device. Further, the solid state imaging device may be configured to output a digital image signal by further providing an analog-to-digital (AD) conversion unit in the solid state imaging device.

Figure 2:
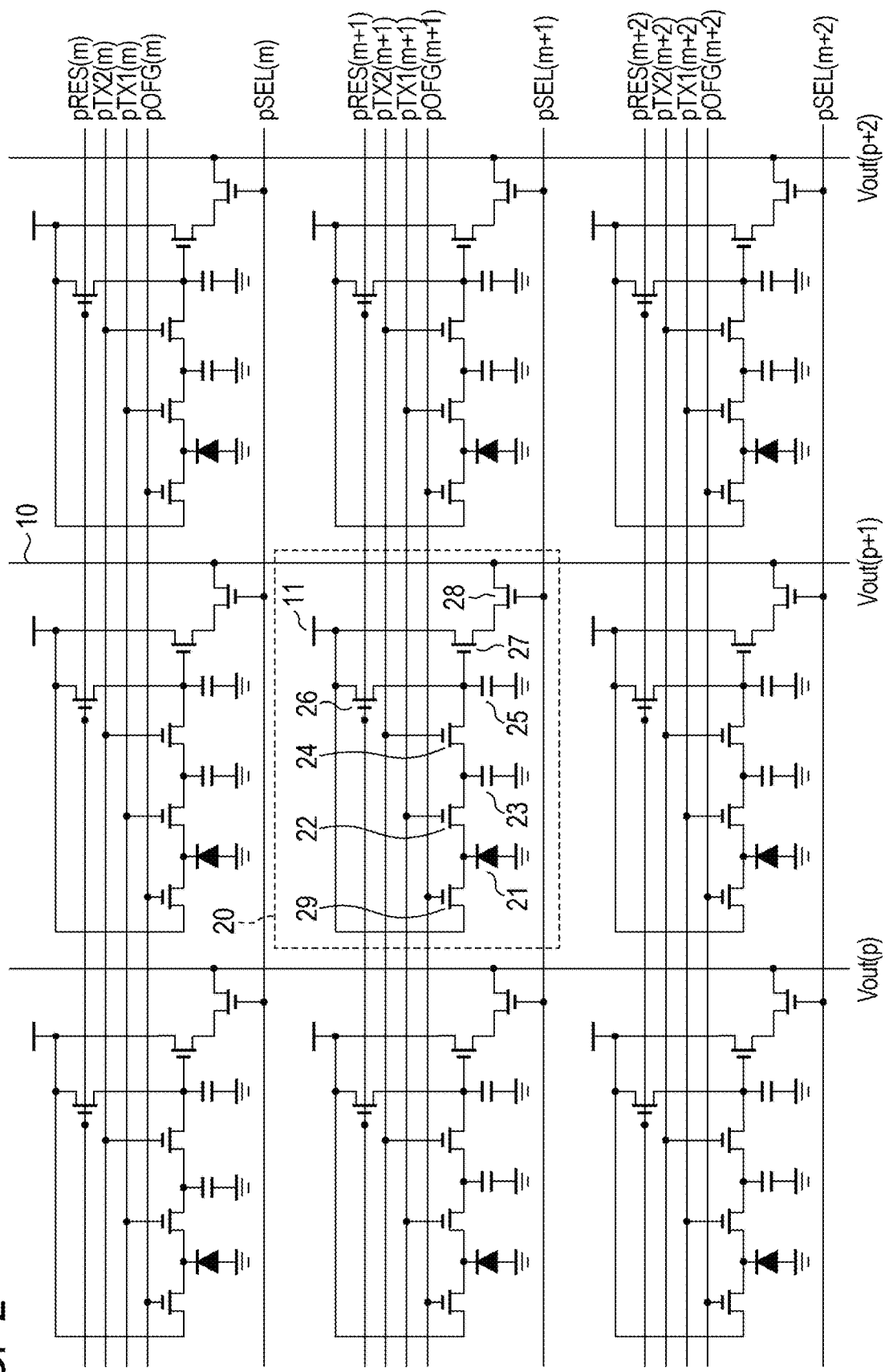
FIG. 2 is an equivalent circuit diagram of pixels included in the solid state imaging device according to the first embodiment.

FIG. 2 is a diagram illustrating an equivalent circuit of the pixels 20 in the imaging device according to the present embodiment. FIG. 2 illustrates nine pixels 20 of three rows by three columns out of the plurality of pixels 20 two-dimensionally arranged in the row direction and the column direction. However, this is an example illustrating a part of the plurality of pixels 20, and the imaging device may have more pixels 20.

Each of the plurality of pixels 20 has a photoelectric conversion unit 21, a charge holding portion 23, a floating diffusion 25, a first transfer transistor 22, a second transfer transistor 24, and a charge draining transistor 29. Furthermore, each of the plurality of pixels includes a reset transistor 26, an amplification transistor 27, and a selection transistor 28. The first transfer transistor 22, the second transfer transistor 24, the reset transistor 26, the amplification transistor 27, the selection transistor 28, and the charge draining transistor 29 are each formed of a MOS transistor. Each control signal for controlling each of these transistors is input from the vertical scanning circuit 101 to the gate of the corresponding transistor via the control line. Although the pixel 20 at the (m+1)-th row and the (p+1)-th column will be focused on to provide description below, other pixels 20 may have the same configuration.

The photoelectric conversion unit 21 includes a photoelectric conversion element such as a photodiode that photoelectrically converts an incident light and accumulates signal charges generated by the photoelectric conversion. The first transfer transistor 22 is controlled by a control signal pTX1 (m+1) input to the gate thereof and, when turned on, transfers charges in the photoelectric conversion unit 21 to the charge holding portion 23. The charge holding portion 23 holds charges transferred from the photoelectric conversion unit 21. The second transfer transistor 24 is controlled by a control signal pTX2 (m+1) input to the gate thereof and, when turned on, transfers charges in the charge holding portion 23 to the floating diffusion 25 that is the input node of the amplification transistor 27. That is, the amplification transistor 27 functions as an amplification unit, and the floating diffusion 25 functions as the input node of the amplification unit that receives charges transferred from the charge holding portion 23.

The drain of the amplification transistor 27 is connected to a power source voltage line 11, and the source of the amplification transistor 27 is connected to the drain of the selection transistor 28. The source of the selection transistor 28 is connected to the vertical output line 10. The vertical output line 10 is connected to a constant current source (not shown). The selection transistor 28 is controlled by a control signal pSEL (m+1) input to the gate thereof and, when turned on, causes the source of the amplification transistor 27 to be connected to the vertical output line 10 to function as a source follower. At this time, an output voltage Vout (p+1) based on the voltage of the floating diffusion 25 is output to the column amplifier circuit 102 via the vertical output line 10 on each column.

The reset transistor 26 is controlled by a control signal pRES (m+1) input to the gate thereof and, when turned on, resets the voltage of the floating diffusion 25. The source of the charge draining transistor 29 is connected to the photoelectric conversion unit 21. The drain of the charge draining transistor 29 is connected to a node having the power source voltage, which is equivalently depicted as being connected to the power voltage line 11 in FIG. 2. The charge draining transistor 29 is controlled by a control signal pOFG (m+1) input to the gate thereof and, when turned on, causes charges accumulated in the photoelectric conversion unit 21 to be drained to the power source voltage line 11 or the like.

The vertical scanning circuit 101 supplies a control signal common to the pixels 20 arranged on the same row. That is, the control signals pTX1 (m+1), pTX2 (m+1), and pOFG (m+1) are supplied to the first transfer transistor 22, the second transfer transistor 24, and the charge draining transistor 29 of the pixels 20 on the (m+1)-th row, respectively. Further, the control signals pSEL (m+1) and pRES (m+1) are supplied to the selection transistor 28 and the reset transistor 26 of the pixels 20 on the (m+1)-th row, respectively. Each of these transistors is in an on-state when the corresponding control signal input to the gate thereof is a high level, and in an off-state when the corresponding control signal input to the gate thereof is a low level.

The charge draining transistors 29 are turned off simultaneously at all the pixels to drain charges accumulated in the photoelectric conversion units 21 and thus has a function of controlling the start time of exposure in a global electronic shutter. The first transfer transistors 22 are turned on simultaneously at all the pixels to transfer charges accumulated in the photoelectric conversion units 21 to the charge holding portions 23 and thus has a function of controlling the end time of exposure in the global electronic shutter.

Note that the names of the source and the drain of a transistor may be different in accordance with the conductivity type, a function in interest, or the like of a transistor and thus the source and the drain described above may be referred by the opposite names.

Figure 3A:
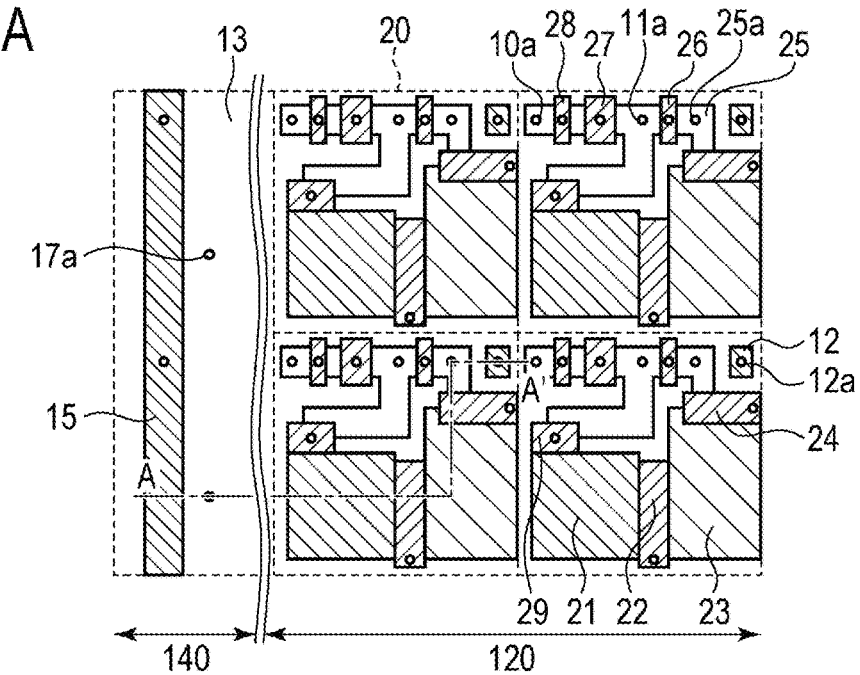
FIG. 3A, FIG. 3B, and FIG. 3C are schematic diagrams illustrating the structure of the solid state imaging device according to the first embodiment.
Figure 3B:
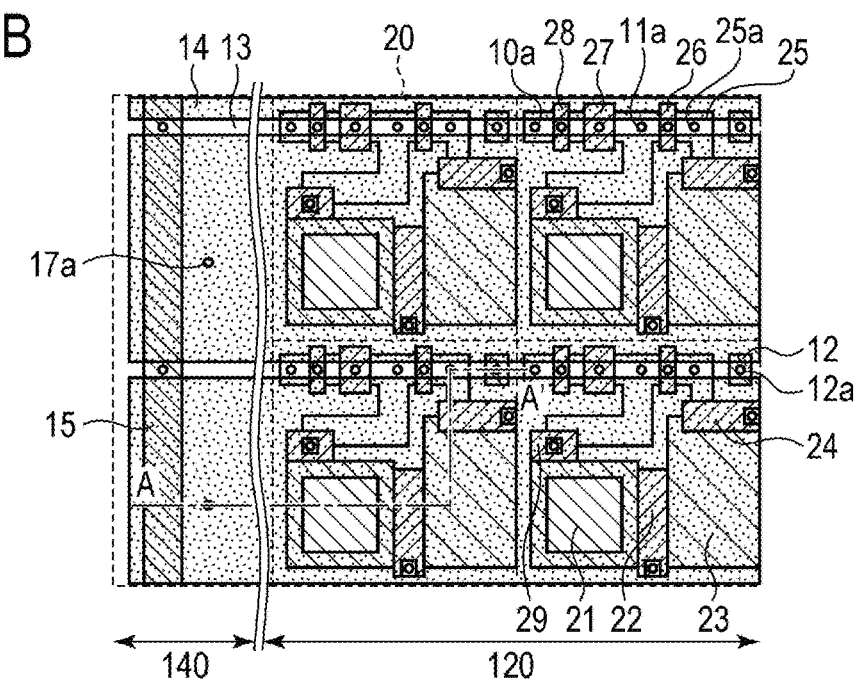
Figure 3C:
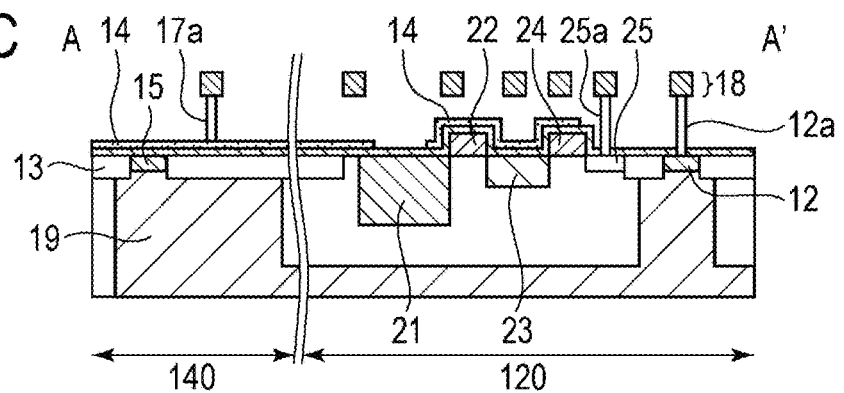

Next, the structure of the solid state imaging device of the first embodiment will be described by using FIG. 3A, FIG. 3B, and FIG. 3C. FIG. 3A is a schematic plan view of the solid state imaging device, which does not depict a light-shielding portion covering the charge holding portion 23 and the like in order to illustrate the element arrangement on the semiconductor substrate. FIG. 3B is a schematic plan view of the solid state imaging device, which illustrates the arrangement of the light-shielding portion. FIG. 3C is a sectional view taken along the line A-A' of the solid state imaging device.

First, with reference to FIG. 3A, the element arrangement of the solid state imaging device will be described. In FIG. 3A, four of the plurality of pixels 20 forming the pixel array 100 are extracted and depicted. Further, FIG. 3A illustrates a pixel region 120 in which the pixels 20 are formed on the semiconductor substrate and a boundary region 140 outside the pixel region 120. Peripheral circuits (not shown in FIG. 3A) such as the vertical scanning circuit 101, the column amplifier circuit 102, the horizontal scanning circuit 103, and the like illustrated in FIG. 1 are formed in a peripheral circuit region (not shown) outside the pixel region 120. The boundary region 140 is a region of the boundary between the peripheral circuit region and the pixel region 120, and no pixel 20 is arranged in the boundary region 140.

Each element provided within the pixel 20 will be described. With respect to the photoelectric conversion unit 21 and the charge holding portion 23, semiconductor regions forming them are illustrated in FIG. 3A. With respect to the first transfer transistor 22, the second transfer transistor 24, the reset transistor 26, the amplification transistor 27, the selection transistor 28, and the charge draining transistor 29, the gate electrodes thereof are illustrated in FIG. 3A. Small circles in the drawings indicate contact plugs that electrically connect gate electrodes on the substrate, semiconductor regions of the active region, and the like to wirings in a wiring layer over the semiconductor substrate. Each of the contact plugs is formed of a metal such as tungsten. A contact plug 10a is connected to the vertical output line 10. A contact plug 11a is connected to the power source voltage line 11. The semiconductor region forming the floating diffusion 25 is connected to the gate of the amplification transistor 27 via a contact plug 25a and a wiring (not shown). A contact plug 12a connects a semiconductor region 12 to a ground line having the ground potential.

In the boundary region 140, a semiconductor region and a contact plug 17a are provided. The functions thereof will be described later. In the pixel region 120 and the boundary region 140, an element isolation region 13 is formed between elements. For example, Local Oxidation of Silicon (LOCOS), Sallow Trench Isolation (STI), or the like may be used as the structure of the element isolation region 13.

With reference to FIG. 3B, the configuration of the light-shielding portion 14 will be described. The light-shielding portion 14 is formed of a material such as tungsten that is less likely to transmit a light. The light-shielding portion 14 covers at least the charge holding portion 23 and is arranged so as to shield it from light. The light-shielding portion 14 extends so as to reach the boundary region 140 from the pixel region 120 without disconnection, as illustrated in FIG. 3B. The light-shielding portion 14 is opened above the photoelectric conversion unit 21 in order to cause a light to enter the photoelectric conversion unit 21. Further, the light-shielding portion 14 is opened in a region in which the contact plugs 10a, 11a, and the like are arranged so as to prevent a short-circuit of these contact plugs and the light-shielding portion 14.

With reference to FIG. 3C, the sectional structure of the solid state imaging device will be described. Wirings of a wiring layer are formed above the semiconductor substrate via an interlayer insulating layer (not shown). The wirings 18 are formed of a metal such as aluminum, copper, or the like. The semiconductor region 12 is connected to the wiring 18 having the ground potential via the contact plug 12a. The semiconductor region forming the floating diffusion 25 is connected to the wiring 18 connected to the gate of the amplification transistor 27 via the contact plug 25a.

Further, the light-shielding portion 14 is connected to the wiring 18 via the contact plug 17a arranged in the boundary region 140. A fixed potential is supplied to the light-shielding portion 14 from the wiring via the contact plug 17a. The fixed potential may be the ground potential, a positive potential, or a negative potential. As illustrated in FIG. 3C, the contact plug 17a is arranged on the opposite side to the semiconductor substrate with respect to the light-shielding portion 14. Due to such a configuration, the contact plug 17a and the light-shielding portion 14 are connected to each other with a low impedance. Further, the semiconductor region 15 is provided in the boundary region 140. The semiconductor region 15 is connected to a well 19 to supply a well potential of the pixel region 120. Although not explicitly illustrated in FIG. 3C, the charge holding portion 23 may be configured to include an accumulation region of the first conductivity type and a semiconductor region of the second conductivity type arranged in the semiconductor substrate. The accumulation region of the first conductivity type accumulates transferred charges. The semiconductor region of the second conductivity type is arranged between the accumulation region and the surface of the semiconductor substrate.

Figure 4:
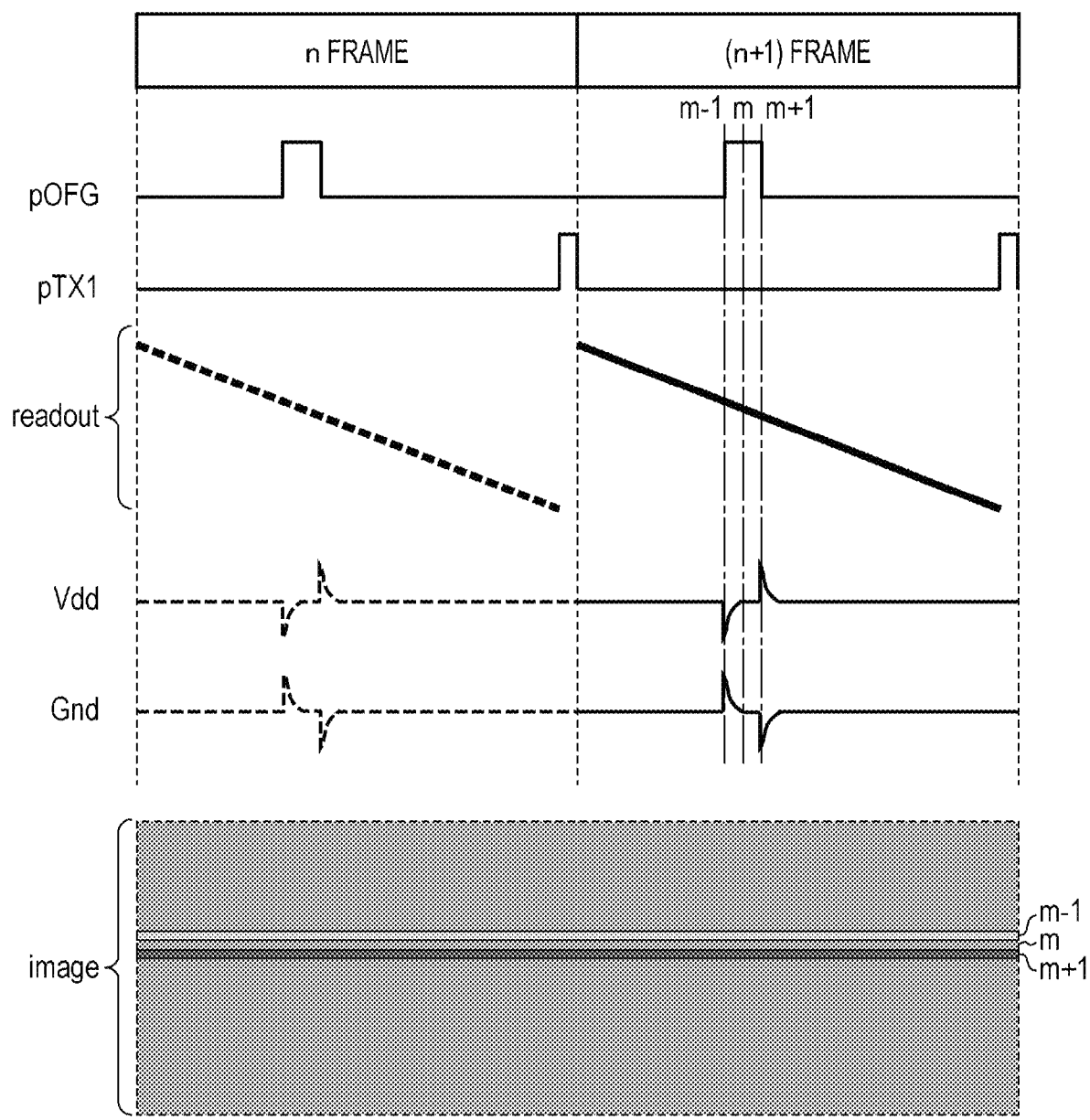
FIG. 4 is a diagram illustrating a timing chart and a band-like noise of the solid state imaging device according to the first embodiment.

FIG. 4 includes a timing chart illustrating a drive method of the solid state imaging device and a diagram illustrating a band-like noise occurring in an image. The advantage of the first embodiment will be described with reference to FIG. 4. FIG. 4 illustrates the control signals pOFG and pTX1 and the timings of readout from the pixels 20 on each column. Here, the control signals pOFG and pTX1 of FIG. 4 are to mean signals supplied to the pixels 20 on all the rows, that is, the depicted pulses are output to all the rows at the same timing.

When the control signal pOFG becomes a high level, charges are drained from the photoelectric conversion units of all the pixels 20. When the control signal pOFG becomes a low level, the photoelectric conversion units 21 start accumulation of charges. Then, when the control signal pTX1 becomes a high level, accumulated charges are transferred to the charge holding portions 23 from the photoelectric conversion units 21 of all the pixels 20. In such a way, a global shutter function in which all the pixels 20 have the same exposure period is implemented. Then, as illustrated with "readout", charges accumulated in the charge holding portions 23 are sequentially read out to the column amplifier circuit 102 on a row basis.

FIG. 4 further illustrates changes in the power source potential (Vdd) and the ground potential (Gnd) and an example of images of the n-th frame and the (n+1)-th frame. First, the reason why such changes in the power source potential (Vdd) and the ground potential (Gnd) occur at the depicted timings and the effect thereof will be described.

A large parasitic capacitance occurs between the first transfer transistor 22 and the light-shielding portion 14. This parasitic capacitance may typically be several tens of thousands pF. Similarly, large parasitic capacitances occur between the charge draining transistor 29 and the light-shielding portion 14 and between the wiring 18 that transmits the control signal and the light-shielding portion 14. When the light-shielding portion 14 is in a floating state, the potential of the light-shielding portion fluctuates through these parasitic capacitances in performing a draining operation and a transfer operation for the global electronic shutter driving described above.

Furthermore, fluctuation of the potential of the light-shielding portion 14 causes fluctuation of the power source potential and the ground potential. FIG. 4 illustrates an example of changes in the power source potential and the ground potential due to fluctuation of the level of the control signal pOFG. Since it is difficult for a horizontal blanking period (several μs or less) to include a period in which the pulse of the control signal pOFG is input, a period in which the power source potential and the ground potential fluctuate may overlap with readout as illustrated in FIG. 4. Thus, fluctuation of the power source potential and the ground potential may affect a signal to be read out. The image of a frame illustrated in FIG. 4 illustrates an example of a band-like noise occurring in an output image when the input timing of the pulse of the control signal pOFG matches the readout timing from the (m−1)-th row to the (m+1)-th row. In this way, when the light-shielding portion 14 is in a floating state, a noise such as a band-like noise may occur due to the parasitic capacitances of the light-shielding portion 14.

In contrast, in the present embodiment, a fixed potential is supplied to the light-shielding portion 14 via the contact plug 17a. This reduces fluctuation of the potential of the light-shielding portion 14 that may be caused in driving of the global electronic shutter. Therefore, fluctuation of the power source potential and the ground potential are reduced allowing for a reduction of noise.

Note that, even when a predetermined potential is supplied to the light-shielding portion 14, the effect of suppressing fluctuation of the potential of the light-shielding portion 14 will be reduced when the supply path thereof has a high impedance, and thus a problem of noise due to the fluctuation of the power source potential and the ground potential may occur. It is therefore desirable that the supply path of the potential to the light-shielding portion 14 have a low impedance. The present embodiment is configured to supply a fixed potential to the light-shielding portion 14 by using the contact plug 17a, which ensures a supply path with a sufficiently low impedance. Therefore, the configuration of the present embodiment is preferable to reduce noise due to a parasitic capacitance of the light-shielding portion 14.

Second Embodiment

Figure 5A:
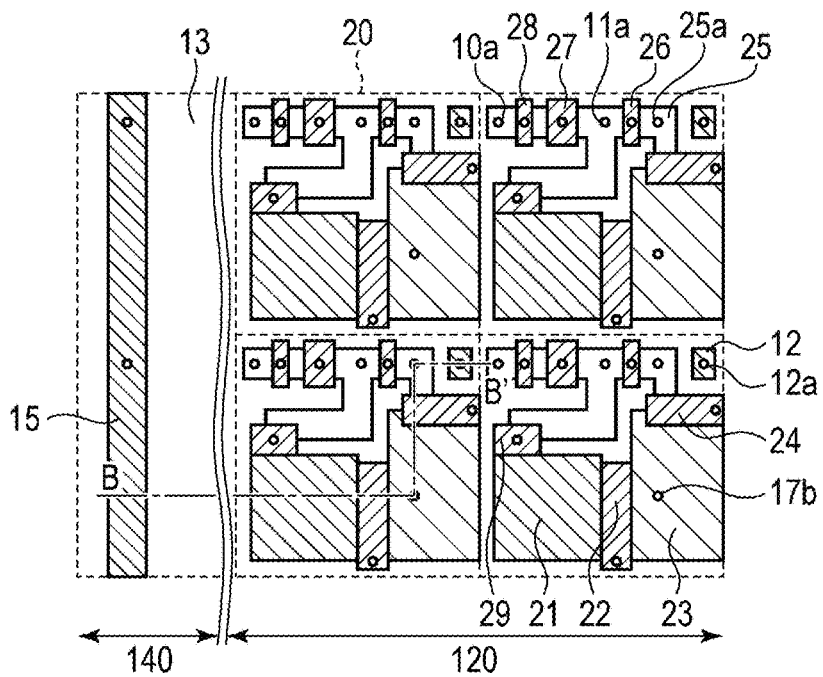
FIG. 5A, FIG. 5B, and FIG. 5C are schematic diagrams illustrating the structure of a solid state imaging device according to a second embodiment.
Figure 5B:
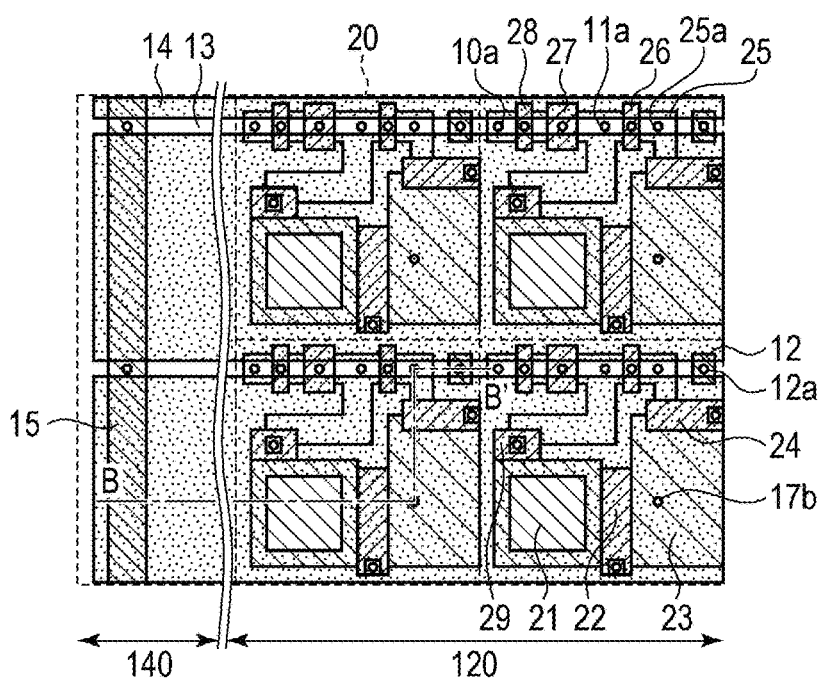
Figure 5C:
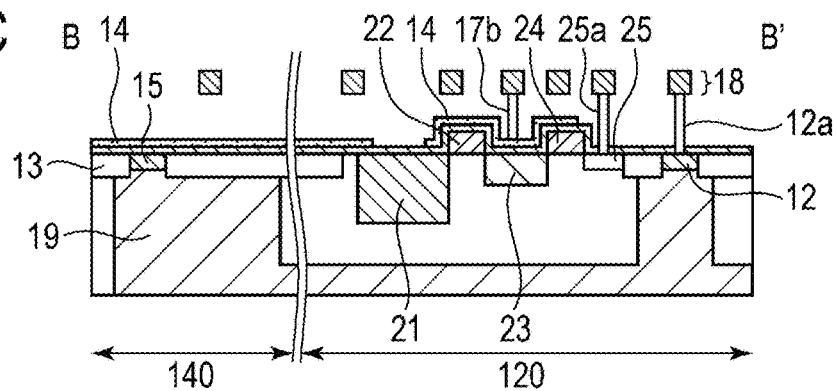

Next, with reference to FIG. 5A, FIG. 5B, and FIG. 5C, the structure of the solid state imaging device according to a second embodiment will be described. FIG. 5A is a schematic plan view of the solid state imaging device, which does not depict the light-shielding portion covering the charge holding portion 23 and the like in order to illustrate the element arrangement on the semiconductor substrate. FIG. 5B is a schematic plan view of the solid state imaging device, which illustrates the arrangement of the light-shielding portion. FIG. 5C is a sectional view taken along the line B-B' of the solid state imaging device. In the following description, the features which are different from those of the first embodiment will be mainly described.

With reference to FIG. 5A, FIG. 5B, and FIG. 5C, contact plugs 17b instead of the contact plugs 17a are connected to the light-shielding portion 14 in the pixel region 120, which makes a difference from the first embodiment. In the present embodiment, since a fixed potential is supplied to the light-shielding portion 14 via the contact plugs 17b within the pixel region 120, this allows for a more uniform potential of the light-shielding portion 14 in the pixel region 120. This allows an advantage of a reduction in shading due to the difference in the amount of potential fluctuation of the light-shielding portion 14 between the pixel 20 arranged on the outer circumference of and the pixel 20 arranged inside the pixel array 100 to be obtained, in addition to the same advantages as in the first embodiment.

Further, since the contact plugs 17b are arranged within the pixel region 120 so as to correspond to the respective pixels 20 as illustrated in FIG. 5A and FIG. 5B, the potential of the light-shielding portion 14 can be further uniform. This further improves the advantage of a reduction of shading.

The contact plugs 17b, 12a, and the like are formed by forming contact holes using etching and then embedding a metal such as tungsten in the contact holes. It is desirable that the contact hole formation of the contact plugs 17b formed on the light-shielding portion 14 be a separate step from the contact hole formation of other contact plugs. Simultaneous formation of the contact hole on the light-shielding portion 14 and the contact holes of the gate electrode or the active region of the semiconductor substrate may cause a metal such as tungsten to be scattered when the light-shielding portion 14 is etched and the scattered metal to be attached to the active region or the like. Such a scattered metal may cause a noise such as a white point to occur in an image. With the contact hole formation of the contact plugs 17b formed on the light-shielding portion 14 being provided as a separate step from the contact hole formation of other contact plugs, such a problem of scattering of a metal is suppressed. Note that, in addition to the configuration of the present embodiment, the contact plug 17a may be further provided in the boundary region 140 in a similar manner to the first embodiment.

Third Embodiment

Figure 6A:
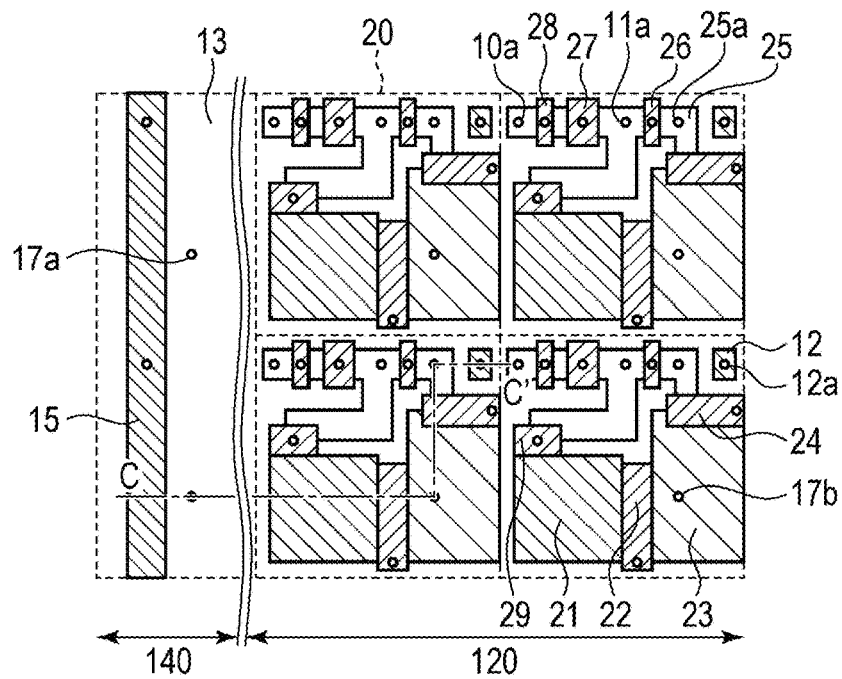
FIG. 6A, FIG. 6B, and FIG. 6C are schematic diagrams illustrating the structure of a solid state imaging device according to a third embodiment.
Figure 6B:
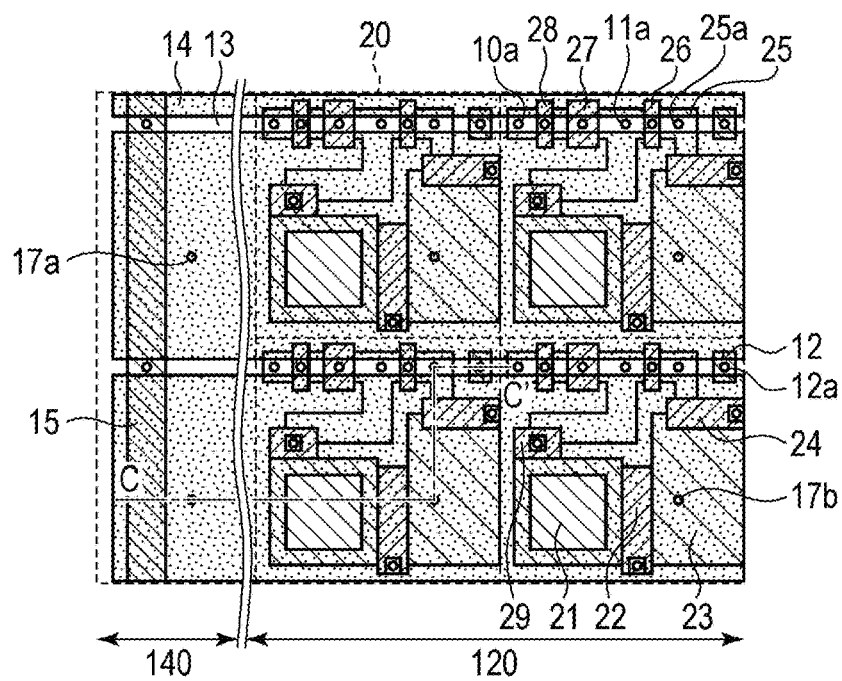
Figure 6C:
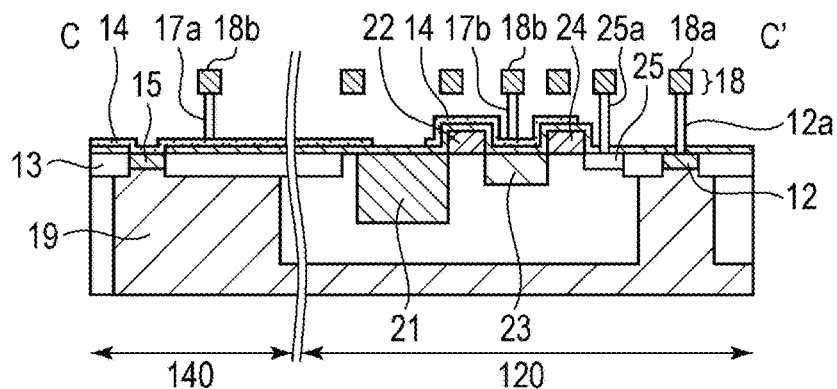

Next, with reference to FIG. 6A, FIG. 6B, and FIG. 6C, the structure of the solid state imaging device according to a third embodiment will be described. FIG. 6A is a schematic plan view of the solid state imaging device, which does not depict the light-shielding portion covering the charge holding portion 23 and the like in order to illustrate the element arrangement on the semiconductor substrate. FIG. 6B is a schematic plan view of the solid state imaging device, which illustrates the arrangement of the light-shielding portion. FIG. 6C is a sectional view taken along the line C-C' of the solid state imaging device. In the following description, the features which are different from those of the first embodiment or the second embodiment will be mainly described.

With reference to FIG. 6A, FIG. 6B, and FIG. 6C, the contact plug 17a is connected to the light-shielding portion 14 in the boundary region 140, and the contact plug 17b is connected to the light-shielding portion 14 in the pixel region 120. Furthermore, in the boundary region 140, the light-shielding portion 14 is connected to the semiconductor region 15 (first semiconductor region) for supplying a well potential to the well 19 (first well) in which the pixel 20 is formed. These features are different from the first embodiment or the second embodiment.

The light-shielding portion 14 extends so as to reach the boundary region 140 from the pixel region 120 without disconnection and has a large area, as illustrated in FIG. 6B. Thus, in a process of depositing the light-shielding portion 14 by sputtering or the like and a process of processing the light-shielding portion 14 by etching or the like, abnormal discharge due to charging may occur.

In contrast, in the present embodiment, since the light-shielding portion 14 is connected to the semiconductor region 15, charges generated by the above-described processes can be dissipated to the substrate, and therefore occurrence of abnormal discharge can be reduced.

A wiring 18b supplies the ground potential (fixed potential) to the light-shielding portion 14 via the contact plugs 17a and 17b. Further, the ground potential is supplied to the well 19 via the semiconductor region 15 connected to the light-shielding portion 14. Thereby, fluctuation of the potential of the light-shielding portion 14 is reduced, and thus the same advantages as in the first embodiment can be obtained. Note that the wiring 18a that supplies the ground potential to the semiconductor region 12 and the wiring 18b that supplies the ground potential to the light-shielding portion 14 may be connected to each other inside the wiring layer.

Note that it is desirable that an alloying process forming an alloy such as CoSi be applied near the surface of the semiconductor region 15 in order to reduce a contact resistance. This can further facilitate dissipation of charges generated by the above-described process to the substrate, which can further reduce occurrence of abnormal discharge.

Fourth Embodiment

Figure 7A:
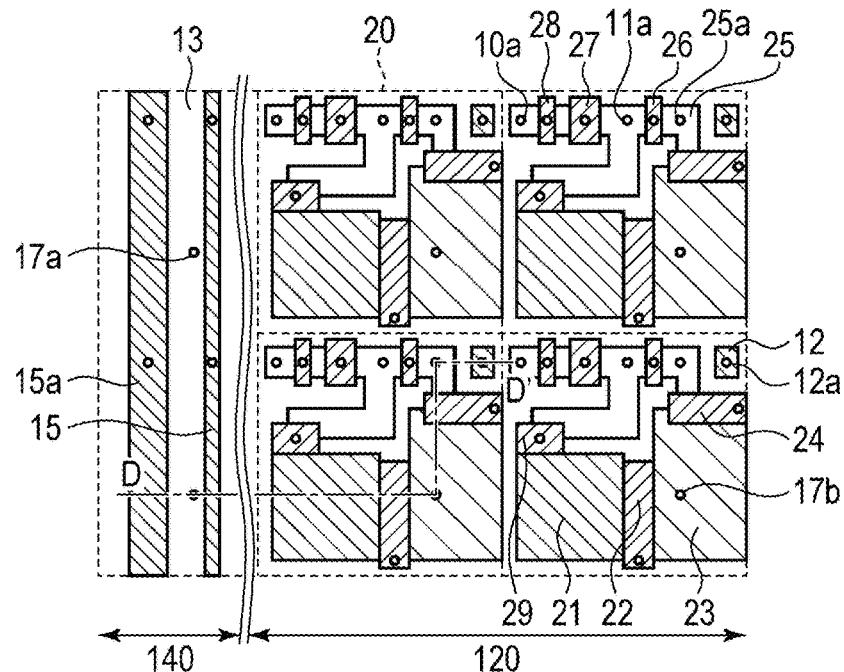
FIG. 7A, FIG. 7B, and FIG. 7C are schematic diagrams illustrating the structure of a solid state imaging device according to a fourth embodiment.
Figure 7B:
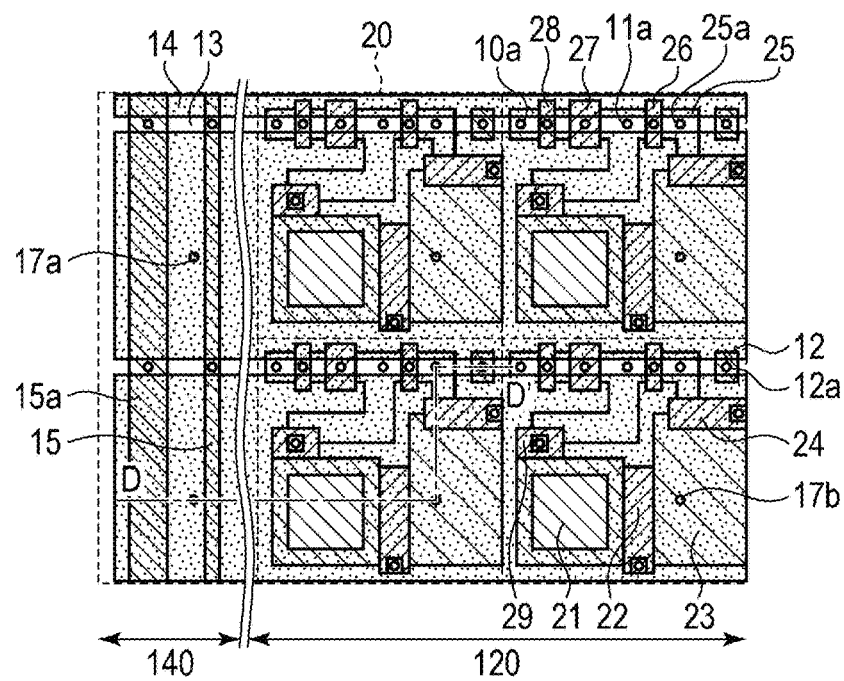
Figure 7C:
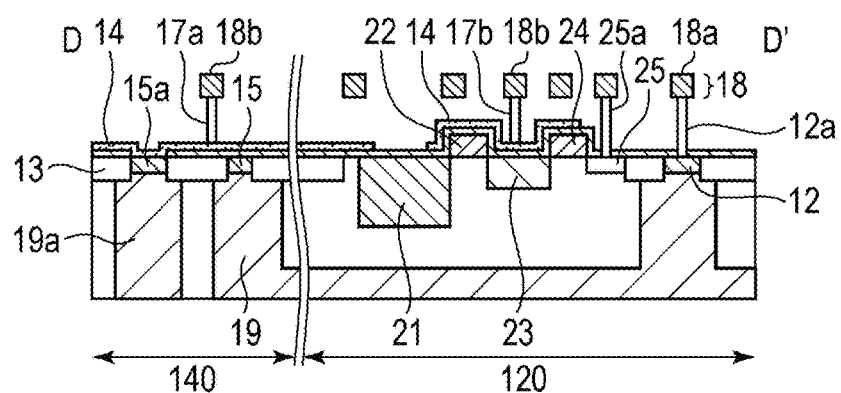

Next, with reference to FIG. 7A, FIG. 7B, and FIG. 7C, the structure of the solid state imaging device according to a fourth embodiment will be described. FIG. 7A is a schematic plan view of the solid state imaging device, which does not depict the light-shielding portion covering the charge holding portion 23 and the like in order to illustrate the element arrangement on the semiconductor substrate. FIG. 7B is a schematic plan view of the solid state imaging device, which illustrates the arrangement of the light-shielding portion. FIG. 7C is a sectional view taken along the line D-D' of the solid state imaging device. In the following description, the features which are different from those of the first embodiment to the third embodiment will be mainly described.

With reference to FIG. 7A, FIG. 7B, and FIG. 7C, in the present embodiment, the light-shielding portion 14 is connected to a semiconductor region 15a (second semiconductor region) that is different from the semiconductor region 15 (first semiconductor region) for supplying the well potential to the well 19 (first well). A well 19a (second well) connected to the semiconductor region 15a is a separate well that is not connected to the well 19. The present embodiment is different from the third embodiment in these features. With such a configuration, in the same manner as the case of the third embodiment, since the light-shielding portion 14 is connected to the semiconductor region 15a, charges generated in a process such as depositing or processing can be dissipated to the substrate, and therefore occurrence of abnormal discharge can be reduced. Note that it is desirable that an alloying process forming an alloy such as CoSi be applied near the surface of the semiconductor region 15a for the same reason as described in the third embodiment.

Furthermore, in the present embodiment, the well 19a to which the light-shielding portion 14 is connected via the semiconductor region 15 is separated from the well 19 that supplies the well potential of the pixel 20. Thus, even when the potential of the well 19a fluctuates in response to fluctuation of the potential of the light-shielding portion 14, the fluctuation of the potential of the well 19 can be reduced. Thereby, fluctuation of the power source potential and the ground potential is further reduced, which can further improve the advantage of noise reduction.

Further, since the well 19a to which the light-shielding portion 14 is connected via the semiconductor region 15 is separated from the well 19 that supplies the well potential of the pixel 20, the potential supplied to the light-shielding portion 14 can be a fixed potential that is different from the ground potential supplied to the well 19. For example, when the charge holding portion 23 is formed of a PIN-type diode, a negative fixed potential can be supplied to the light-shielding portion 14. In this case, holes are excited at the interface of the semiconductor forming the charge holding portion 23, and it is therefore possible to reduce a dark current occurring in a period in which the charge holding portion 23 holds charges and to reduce noise due to the dark current.

Fifth Embodiment

Figure 8:
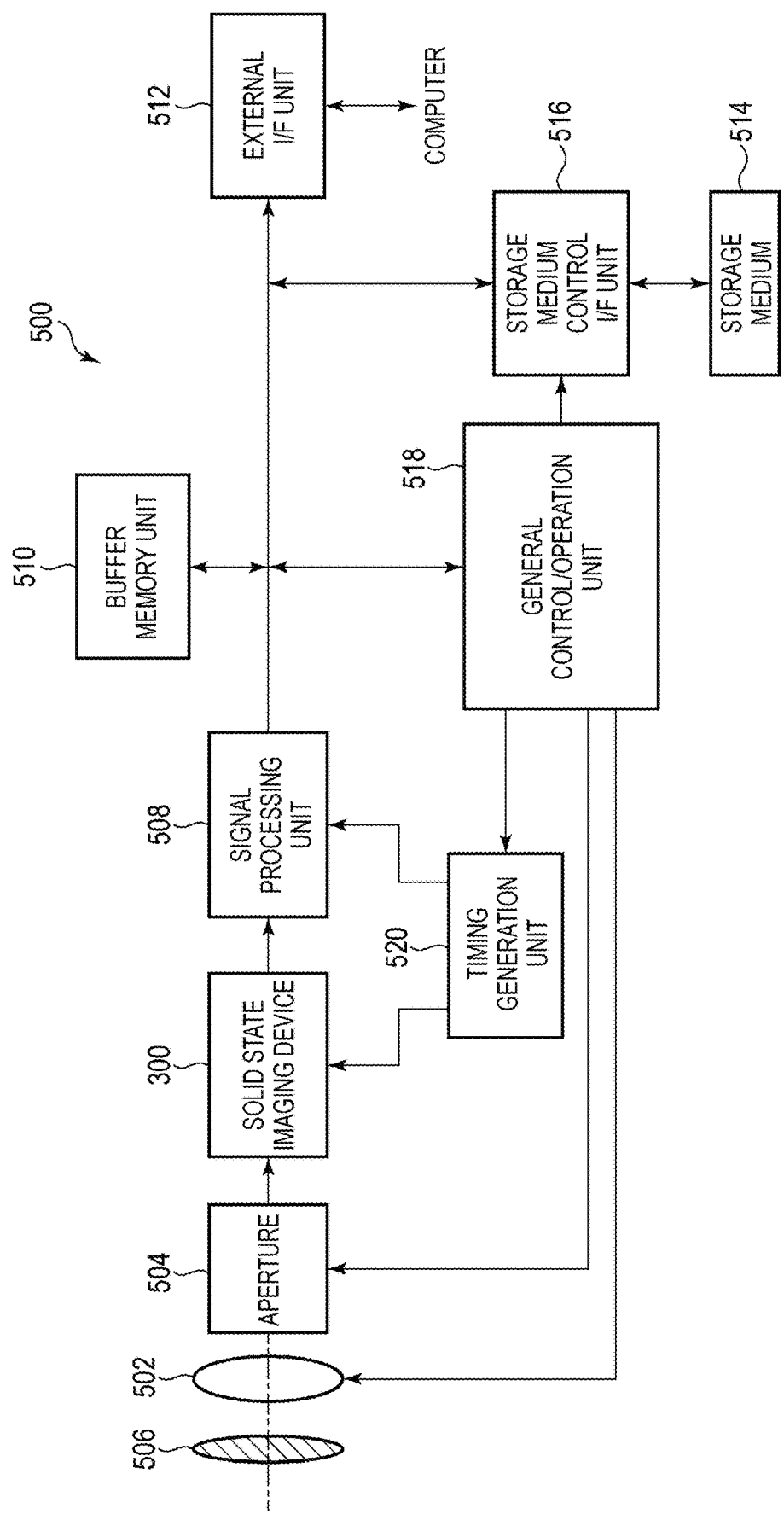
FIG. 8 is a block diagram of an imaging system according to a fifth embodiment.

Next, an example of an apparatus to which the solid state imaging device according to any of the above-described embodiments is applied will be described. FIG. 8 is a block diagram illustrating the configuration of an imaging system 500 according to the present embodiment. A solid state imaging device 300 illustrated in FIG. 8 is any of the solid state imaging devices described in the above first to fourth embodiments. The imaging system 500 to which the solid state imaging device 300 can be applied may be, for example, a digital still camera, a digital camcorder, a surveillance camera, or the like. FIG. 8 illustrates an example configuration of a digital still camera to which the solid state imaging device 300 of any of the above-described embodiments is applied.

The imaging system 500 illustrated in FIG. 8 has the solid state imaging device 300, a lens 502 that causes an optical image of a subject to be captured onto the solid state imaging device 300, an aperture 504 for changing the amount of a light passing through the lens 502, and a barrier 506 for protecting the lens 502. The lens 502 and the aperture 504 form an optical system that converges a light onto the solid state imaging device 300.

The imaging system 500 further has a signal processing unit 508 that performs processing of an output signal output from the solid state imaging device 300. The signal processing unit 508 performs signal processing operations of performing, if necessary, various correction and compression on an input signal for output. The signal processing unit 508 may have a function of performing AD conversion process on an output signal output from the solid state imaging device 300. In this case, the AD converter circuit is not necessarily required to be provided inside the solid state imaging device 300.

The imaging system 500 further has a buffer memory unit 510 for temporarily storing image data and an external interface unit (external I/F unit) 512 for communicating with an external computer or the like. Furthermore, the imaging system 500 has a storage medium 514 such as a semiconductor memory or the like for performing recording or readout of captured data and a storage medium control interface unit (storage medium control I/F unit) 516 for performing recording to or readout from the storage medium 514. Note that the storage medium 514 may be embedded in the imaging system 500 or may be removable.

Furthermore, the imaging system 500 has a general control/operation unit 518 that performs various operation and controls the entire digital still camera and a timing generation unit 520 that outputs various timing signals to the solid state imaging device 300 and the signal processing unit 508. Here, the timing signal or the like may be supplied from the outside, and the imaging system 500 may be any imaging system as long as it has at least the solid state imaging device 300 and the signal processing unit 508 that processes an output signal output from the solid state imaging device 300. The general control/operation unit 518 and the timing generation unit 520 may be configured to perform some or all of the control functions of the control circuit 105 or the like of the solid state imaging device 300.

The solid state imaging device 300 outputs a signal used for an image to the signal processing unit 508. The signal processing unit 508 performs predetermined signal processing on the signal used for an image output from the solid state imaging device 300 to output image data. Further, the signal processing unit 508 uses the signal used for an image to generate an image.

By forming an imaging system using the solid state imaging device 300 according to the first to fourth embodiments, an imaging system that can acquire a better quality image can be realized.

Sixth Embodiment

Figure 9A:
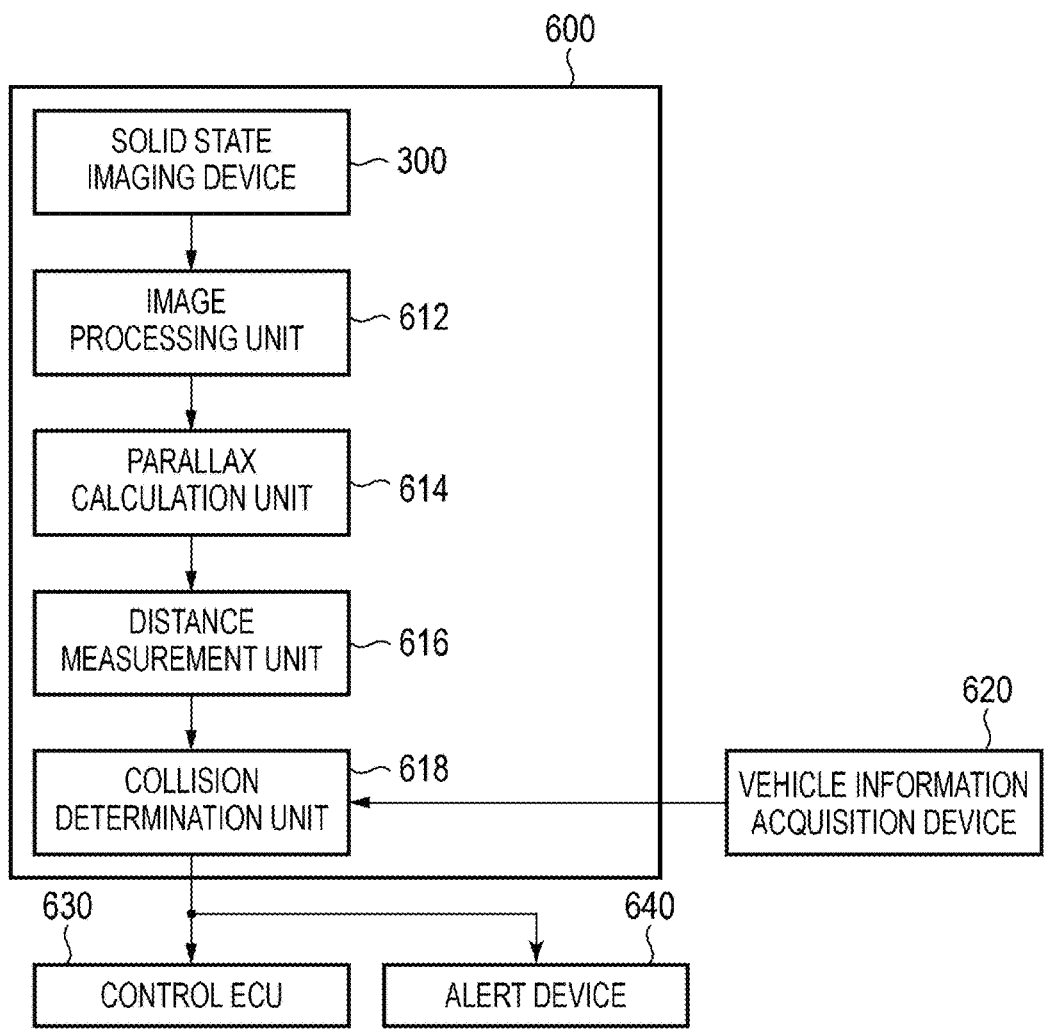
FIG. 9A and FIG. 9B are block diagrams of an imaging system and a mobile apparatus according to a sixth embodiment.
Figure 9B:
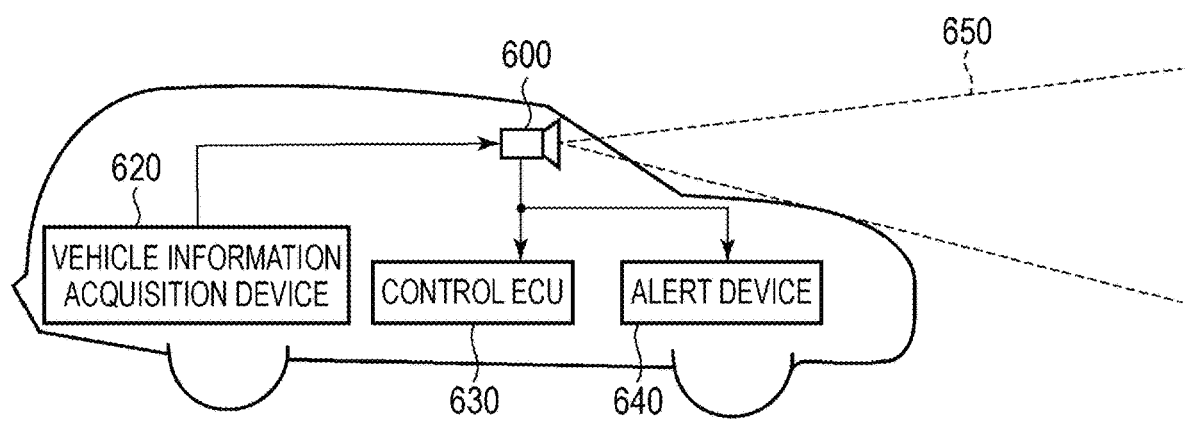

FIG. 9A and FIG. 9B are diagrams illustrating the configuration of an imaging system 600 and a mobile apparatus according to the present embodiment. FIG. 9A illustrates an example of the imaging system 600 for an on-vehicle camera. The imaging system 600 has the solid state imaging device 300. The solid state imaging device 300 is any of the solid state imaging devices 300 described in the above first to fourth embodiments. The imaging system 600 has an image processing unit 612 that performs image processing on a plurality of image data acquired by the solid state imaging device 300 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Here, the parallax calculation unit 614 and the distance measurement unit 616 are an example of a distance information acquisition unit that acquires distance information on the distance to the object. That is, the distance information is information regarding a parallax, a defocus amount, a distance to an object, or the like. The collision determination unit 618 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like, or may be implemented by combination thereof.

The imaging system 600 is connected to the vehicle information acquisition device 620 and can acquire vehicle information such as a vehicle speed, a yaw rate, a steering angle, or the like. Further, the imaging system 600 is connected with a control ECU 630, which is a control device that outputs a control signal for causing a vehicle to generate braking force based on a determination result by the collision determination unit 618. That is, the control ECU 630 is an example of a mobile apparatus control unit that controls a mobile apparatus based on distance information. Further, the imaging system 600 is connected with an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 9B illustrates the imaging system 600 in a case of capturing a front area of a vehicle (a capturing area 650). The vehicle information acquisition device 620 transmits instructions to operate the imaging system 600 and perform capturing of an image. With a use of the solid state imaging device 300 according to the first to fourth embodiments, the imaging system 600 of the present embodiment can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, it should be appreciated that an embodiment in which a part of the configuration of any of the embodiments is added to another embodiment or an embodiment in which a part of the configuration of any of the embodiments is replaced with a part of the configuration of another embodiment may also be one embodiment of the present invention.

This application claims the benefit of Japanese Patent Application No. 2017-009174, filed Jan. 23, 2017, which is hereby incorporated by reference herein in its entirety.

What is claimed is:
1. A photoelectric conversion device comprising:
  a semiconductor substrate including a pixel region in which a plurality of pixels are arranged, each of the pixels including a photoelectric conversion unit configured to accumulate charges generated from an incident light, a charge holding portion configured to hold the charges transferred from the photoelectric conversion unit, a transfer transistor including a gate electrode and configured to transfer the charges generated by the photoelectric conversion unit to the charge holding portion, an amplification unit including an input node configured to receive the charges transferred from the charge holding portion, and a boundary region arranged outside the pixel region;
a light-shielding portion arranged so as to cover at least the charge holding portion, extending over at least two or more of the plurality of pixels, and extending so as to reach the boundary region from the pixel region;
a first contact plug connected to the light-shielding portion;
a wiring connected to the first contact plug to supply a fixed potential to the light-shielding portion via the first contact plug;
a second contact plug connected to the gate electrode, the second contact plug being different from the first contact plug,
a first semiconductor region arranged in the boundary region and connected to a first well in which each of the plurality of pixels is formed; and
a second semiconductor region arranged in the boundary region and connected to a second well,
wherein the light-shielding portion, the first contact plug, and the wiring are arranged in order from the semiconductor substrate,
wherein the light-shielding portion and the gate electrode are electrically separated from each other, and
wherein the second semiconductor region is connected to the light-shielding portion.

2. The photoelectric conversion device according to claim 1, wherein the first contact plug is arranged in the boundary region.

3. The photoelectric conversion device according to claim 1, wherein the first contact plug is arranged in the pixel region.

4. The photoelectric conversion device according to claim 3, wherein the first contact plug is arranged so as to correspond to each of the plurality of pixels of the pixel region.

5. The photoelectric conversion device according to claim 1 further comprising a first semiconductor region arranged in the boundary region and connected to a first well in which each of the plurality of pixels is formed,
wherein the first semiconductor region is connected to the light-shielding portion.

6. The photoelectric conversion device according to claim 1, wherein the fixed potential is a potential that is different from a potential supplied to the first well.

7. The photoelectric conversion device according to claim 1, wherein the charge holding portion includes an accumulation region of a first conductivity type that is arranged in the semiconductor substrate and accumulates charges and a semiconductor region of a second conductivity type that is arranged between the accumulation region and a surface of the semiconductor substrate.

8. The photoelectric conversion device according to claim 1, wherein the fixed potential is a ground potential.

9. The photoelectric conversion device according to claim 1, wherein the first contact plug is arranged in the pixel region.

10. The photoelectric conversion device according to claim 9, wherein the fixed potential is a ground potential.

11. An imaging system comprising:
the photoelectric conversion device according to claim 1; and
a signal processor configured to process a signal output from the photoelectric conversion device.

12. A mobile apparatus comprising:
the photoelectric conversion device according to claim 1;
a distance information acquisition unit configured to acquire distance information of a distance to an object, from parallax images based on a signal from the photoelectric conversion device; and
a mobile apparatus controller configured to control the mobile apparatus based on the distance information.

13. A photoelectric conversion device comprising:
a semiconductor substrate including a pixel region in which a plurality of pixels are arranged, each of the pixels including a photoelectric conversion unit configured to accumulate charges generated from an incident light, a charge holding portion configured to hold the charges transferred from the photoelectric conversion unit, and an amplification unit including an input node configured to receive the charges transferred from the charge holding portion;
a light-shielding portion arranged so as to cover at least the charge holding portion and extending over at least two or more of the plurality of pixels;
a contact plug connected to the light-shielding portion; and
a wiring connected to the contact plug to supply a fixed potential to the light-shielding portion via the contact plug,
wherein the semiconductor substrate includes a boundary region arranged outside the pixel region,
wherein the light-shielding portion extends so as to reach the boundary region from the pixel region,
wherein a first semiconductor region arranged in the boundary region and connected to a first well in which each of the plurality of pixels is formed,
wherein a second semiconductor region arranged in the boundary region and connected to a second well that is not connected to the first well, and
wherein the second semiconductor region is connected to the light-shielding portion.

14. The photoelectric conversion device according to claim 13, wherein the fixed potential is a potential that is different from a potential supplied to the first well.

15. The photoelectric conversion device according to claim 13, wherein the fixed potential is a ground potential.

16. An imaging system comprising:
the photoelectric conversion device according to claim 13; and
a signal processor configured to process a signal output from the photoelectric conversion device.

17. A mobile apparatus comprising:
the photoelectric conversion device according to claim 13;
a distance information acquisition unit configured to acquire distance information of a distance to an object, from parallax images based on a signal from the photoelectric conversion device; and
a mobile apparatus controller configured to control the mobile apparatus based on the distance information.

* * * * *